United States Patent
Camiade et al.

(10) Patent No.: US 8,624,373 B2
(45) Date of Patent: Jan. 7, 2014

(54) MINIATURE ELECTRONIC COMPONENT FOR MICROWAVE APPLICATIONS

(75) Inventors: Marc Camiade, Bures sur Yvette (FR); Pierre Quentin, Le Kremlin Bicetre (FR); Olivier Vaudescal, Magny-les-Hameaux (FR)

(73) Assignee: United Monolithic Semiconductor S.A., Orsay (FR)

( * ) Notice: Subject to any disclaimer, the term of this patent is extended or adjusted under 35 U.S.C. 154(b) by 866 days.

(21) Appl. No.: 11/722,306

(22) PCT Filed: Dec. 7, 2005

(86) PCT No.: PCT/EP2005/056584
§ 371 (c)(1),
(2), (4) Date: Nov. 5, 2009

(87) PCT Pub. No.: WO2006/067046
PCT Pub. Date: Jun. 29, 2006

(65) Prior Publication Data
US 2010/0038775 A1 Feb. 18, 2010

(30) Foreign Application Priority Data
Dec. 20, 2004 (FR) ...................................... 04 13583

(51) Int. Cl.
*H01L 23/02* (2006.01)
(52) U.S. Cl.
USPC .................................. 257/686; 257/E21.499
(58) Field of Classification Search
USPC .................................. 257/728, 686, E21.499
See application file for complete search history.

(56) References Cited

U.S. PATENT DOCUMENTS 5,138,436 A * 8/1992 Koepf ............................ 257/728
5,313,175 A * 5/1994 Bahl et al. ..................... 333/116
(Continued)

FOREIGN PATENT DOCUMENTS

| JP | 60-192401 | 9/1985 |
| JP | 62-029203 | 2/1987 |
| JP | 409083241 A * | 3/1997 |

OTHER PUBLICATIONS

Gresham, I. et al. "A 76-77GHZ Pulsed-Doppler Radar Module for Autonomous Cruise Control Applications", Microwave Symposium Digest, 2000 IEEE MTT-S International Boston, MA, USA. Jun. 11-16, 2000, Piscataway, NJ, USA, IEEE, US, vol. 3, Jun. 11, 2000, pp. 1551-1554, XP010507151, ISBN: 0-7803-5687-X.

*Primary Examiner* — David Vu
(74) *Attorney, Agent, or Firm* — Lowe Hauptman & Ham, LLP

(57) ABSTRACT

The invention relates to a miniature microwave component having: a microwave chip (18, 60, 140) encapsulated in an individual package (61) for surface mounting. A metal base (80) mounts the chip in the package via its rear face. The base has an aperture (82). At least two access ports are provided for the communication of electrical signals between the inside and the outside of the package. A contactless microwave access port (62), by electromagnetic coupling at the aperture in the base, ensures transmission of coupling signals at a working frequency $F_0$. A subharmonic access port (110) via a contact, inputs, into the integrated circuit, a subharmonic frequency $F_0/n$ of the working frequency $F_0$. The chip includes, among its electrical conductors, a coupling electrical conductor (96) connected to the electronic elements of the chip. The coupling conductor is placed at the contactless microwave access port (62) in order to transmit microwave signals by electromagnetic coupling at the working frequency $F_0$.

15 Claims, 5 Drawing Sheets

(56) References Cited

U.S. PATENT DOCUMENTS

| | | | |
|---|---|---|---|
| 5,532,506 A * | 7/1996 | Tserng | 257/276 |
| 5,955,752 A * | 9/1999 | Fukaya et al. | 257/275 |
| 6,727,777 B2 * | 4/2004 | McDonough et al. | 333/33 |
| 6,850,128 B2 * | 2/2005 | Park | 333/26 |
| 7,046,959 B2 * | 5/2006 | Ammar et al. | 455/13.1 |
| 2003/0160322 A1 * | 8/2003 | Hsieh et al. | 257/728 |

* cited by examiner

MINIATURE ELECTRONIC COMPONENT FOR MICROWAVE APPLICATIONS

CROSS-REFERENCE TO RELATED APPLICATIONS

The present Application is based on International Application No. PCT/EP2005/056584, filed on Dec. 7, 2005, which in turn corresponds to France Application No. 0413583 filed on Dec. 20, 2004, and priority is hereby claimed under 35 USC §119 based on these applications. Each of these applications are hereby incorporated by reference in their entirety into the present application.

FIELD

The invention relates to electronic components operating at millimetric frequencies and comprising a contactless electromagnetic access port.

BACKGROUND

These types of electronic component comprising at least one chip (or integrated circuit) operating at millimetric frequencies have applications in particular in the automobile radar field. In these types of application, an electromagnetic wave is transmitted at a millimetric frequency and the wave reflected by an obstacle is received by an antenna, in order to extract from this wave distance information, on the one hand, and relative speed on the other hand, between this obstacle and the source that transmitted the wave. For this purpose, the vehicle is equipped with a system comprising radars positioned all around the vehicle for detecting objects. Long-range radars, for example operating at 77 GHz, are positioned at the front of the vehicle and short-range radars, operating at 24 GHz and 79 GHz, are positioned on the rear and along the sides of the vehicle.

The distance and relative speed information is transmitted to a central processing unit of the system which ensures, for example, that the vehicle is kept at a specified distance from the objects or from another moving vehicle traveling on the same road.

The objective of these systems using automobile radars is firstly to provide driving comfort with functions for servo-controlling the speed of the vehicle relative to another vehicle preceding it, but also to signal potential hazards.

In general, these systems using automobile radars comprise elementary frequency generation and microwave transmit/receive functions.

The components operating at millimetric frequencies may also be used for short-range very high-data-rate communication applications.

Whatever the application, the electronic processing of millimetric-frequency signals includes a low-frequency processing part that may be carried out by silicon integrated circuits mounted on printed circuits. This part may be carried out by very well-established and low-cost technologies, with connections that are simple to produce between circuit elements on one and the same integrated circuit chip or between various integrated circuit chips. The processing also includes a part of very high frequency (above 45 GHz), which can be implemented only by components and integrated circuits made of semiconductor materials suitable for microwave applications (gallium arsenide GaAs, and especially its derivatives, or else SiGe). These integrated circuits are called MMICs (microwave monolithic integrated circuits). This very high-frequency part poses difficult production problems and in general turns out to be very expensive.

For relatively complex functions, components are encapsulated in a metal package containing a large number of MMIC chips, the quantity of circuit elements that can be placed in one and the same chip being more limited in the case of MMIC circuits than in the case of low-frequency silicon circuits. These chips are mounted on a substrate having interconnections that are difficult to produce and therefore expensive, owing to the very high frequencies at which they work.

Mounting chips on a hybrid substrate (mounting in general with wire bonding to connect the chips to the hybrid substrate) is itself very expensive when there are many chips to be mounted.

These components include, especially in the case of automobile applications, contactless access ports operating by electromagnetic coupling for transmitting and receiving the waves.

Transmission by electromagnetic coupling at these very high frequencies is accomplished by using the free propagation properties of electromagnetic signals inside the package and in particular between the inside and the outside. This package includes in particular a conducting cap (a metal or metallized cap) that encloses the signal propagation lines coming from the chip or going to the chip. The conducting cap is located above the external contactless access port, at a distance such that it constitutes (at the main working frequency for which the component is designed) an electromagnetic short-circuit promoting free-propagation signal transmissions via this access port.

Access ports at the working frequency $F_0$ of more than 45 GHz are transitions by electromagnetic coupling in the air (or in a gas or in a vacuum) and especially conducting elements capable of radiating toward a waveguide placed facing these elements, or capable of receiving electromagnetic radiation output by a waveguide in front of which they are placed. The package in which the MMIC chips are contained includes a nonconducting part facing these conducting elements so as to let the electromagnetic energy pass between the waveguide and the conducting elements.

FIG. 1 shows a component of the prior art for automobile applications. The component is encapsulated in a package 10 that includes a contactless electromagnetic access port 12.

The component comprises a metal base 14 serving as substrate on which there are directly mounted, via its rear face 16, an MMIC microwave chip 18, a double-sided ceramic substrate 20, serving for interconnections to the inside of the package and to the outside of the package, and a metal or metallized cap 19 covering the base, in order to enclose, between the base and the cap, the chip and the ceramic substrate 20. The MMIC chip 18 is soldered directly to the base 14.

The ceramic substrate 20 is preferably a substrate metallized on both its faces 24, 26, comprising metallizations 30 on its front face 24, in order to form transmission lines, and metallizations 32 on its rear face 26, in order to form a ground plane.

The dimensions of the various dielectric and conducting parts are such that the component operates correctly at the working frequency in question $F_0$ (77 GHz). The metallizations 30 and 32 serve on the one hand to establish interconnections between chips and, on the other hand, to establish the external access ports of the package.

The access port 12 of the component shown in FIG. 1 comprises a contactless electromagnetic coupling transition allowing the signal at the frequency of 77 GHz to pass, contactlessly, from a waveguide to the MMIC chip 18, or vice versa.

This electromagnetic coupling transition is preferably made by means of an aperture 36 in the package 10, and more precisely in the metal base 14.

The substrate 20 includes a radiating element 38 communicating for example with a waveguide placed in front of the aperture 36, the radiating element acting as element for receiving and transmitting an incoming or outgoing electromagnetic wave in the package.

The electrical connections between the substrate 20 and the chip 18 are produced by wire bonding.

The component includes other access ports 44 operating at frequencies below those of the microwave access port. The MMIC chip is also connected to these other access ports 44 by wire bonding 46.

The component is connected to another, similar component or to a different component mounted on a conventional printed circuit via the other access ports 44.

In the automobile radar application, the increase in number of functionalities of such systems entails the use of an increasingly large number of detection radars all around the vehicle and thereby requires greater effort to reduce the costs of the elementary functions of the system.

One of the major problems for these automobile applications is the cost of the millimetric transceiver module. This cost results from the components used, but also from the assembly technology used to fabricate these modules.

The existing solutions do not allow the market-driven cost objectives to be achieved. These solutions are limited for two essential reasons, namely the implementation cost (equipment, training, reproducibility) and the production costs.

SUMMARY

The invention provides, in particular for reducing the production cost of microwave components having contactless access ports, a miniature microwave component comprising:

a microwave chip encapsulated in an individual package for surface mounting, the chip having an active face, which includes electronic elements and electrical conductors on the active face, and, opposite the active face, a rear face which includes electrical conductors on the rear face and among these conductors on the rear face an electrical conductor forming a ground plane;

a metal base for mounting the chip in the package via its rear face, said base having an aperture; and at least two access ports for the communication of electrical signals between the inside and the outside of the package, a contactless microwave access port, by electromagnetic coupling at the aperture in the base, ensuring transmission of coupling signals at a working frequency $F_0$, a subharmonic access port via a contact, for inputting, into the integrated circuit, a subharmonic frequency $F_0/n$ of the working frequency $F_0$, characterized in that the chip includes, among its electrical conductors, a coupling electrical conductor connected to the electronic elements of the chip, the coupling conductor being placed at the contactless microwave access port in order to transmit microwave signals by electromagnetic coupling at the working frequency $F_0$.

One main objective of the microwave component according to the invention is to reduce the cost of fabricating the component and to simplify its fabrication.

A second objective is to be able to use a component fabrication technology very close to the technologies currently used for fabricating components in high volume, for example those used for components in plastic packages.

Another objective of the component is its compatibility with surface mounting techniques, this representing a major benefit in the case of applications at such millimetric frequencies.

The electrical coupling conductor of the chip acts as an electromagnetic sensor coupled to a waveguide formed by the contactless access port of the package.

The microwave component according to the invention preferably includes, in addition to a contactless access port capable of effective coupling at above 45 GHz (at least up to 120 GHz), an access port not capable of effectively working at a frequency above 45 GHz but designed to work at a subharmonic of the working frequency. For this purpose, the integrated circuit preferably includes frequency multiplication means necessary for switching the subharmonic frequency $F_0/n$ (n being an integer) to the working frequency $F_0$.

The access port incapable of working at 77 GHz but capable of working up to 40 GHz, or a little higher, is produced, on the integrated circuit, by means of microstrip lines or coaxial lines.

The connection between the integrated circuit and other components placed on the same substrate will be easily accomplished owing to the fact that the transported frequencies are much lower than the millimetric working frequency.

In a first embodiment of the microwave component according to the invention, the package includes a conducting cap placed a certain distance from the coupling conductor such that it establishes, above the contactless microwave access port, an electromagnetic short-circuit at the working frequency $F_0$, thus forming a wave reflector promoting transmission of this working frequency $F_0$ through the microwave access port.

In another embodiment of the microwave component, the electrical coupling conductor and a ground plane of the chip form a slot antenna promoting transmission of the working frequency through the contactless microwave access port.

BRIEF DESCRIPTION OF THE DRAWINGS

Other features and advantages of the invention will become apparent on reading the detailed description that follows, this being given with is reference to the appended drawings in which:

FIGS. 2a and 2b show, in a sectional view and in a top view respectively, a first exemplary embodiment of a microwave component according to the invention.

Figure 1:
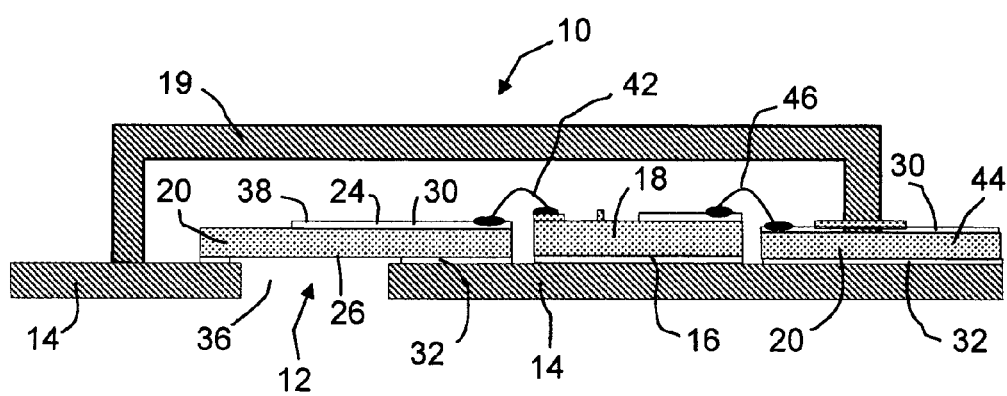
FIG. 1, already described, represents a packaged millimetric-frequency component of the prior art.
Figure 2A:
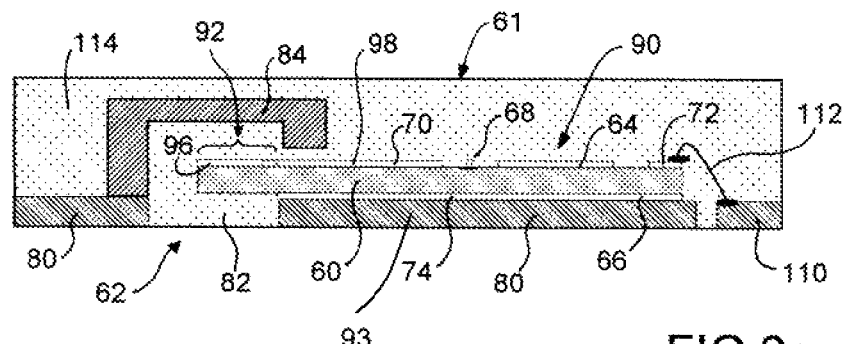
FIGS. 2a and 2b show views of a first embodiment of the microwave component according to the invention.
Figure 2B:
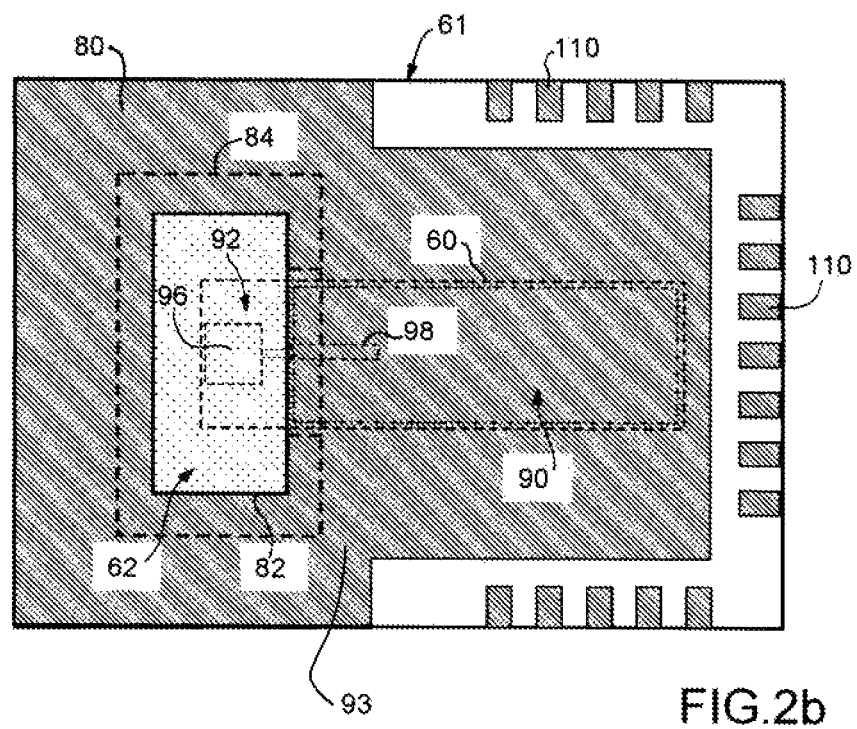

The component in FIGS. 2a and 2b comprises an MMIC chip 60 encapsulated in a package 61 having an electromagnetic coupling access port 62.

The MMIC chip 60 has an active face 64 and a rear face 66, opposite the active face. Both faces 64 and 66 are metallized.

The active face 64 has electronic components 68 and electrical conductors 70, 72 on the active face. The rear face 66 has electrical conductors on the rear face and among these conductors on the rear face is a conductor forming a ground plane 74.

The package 61 comprises a metal base 80 serving as substrate on which the MMIC chip 60 is directly mounted via its rear face 66, the base having an aperture 82 for passage of the electromagnetic waves received or transmitted by the integrated circuit, forming, with a metal cap 84 mounted on the metal base, the contactless electromagnetic coupling access port 62.

The MMIC chip 60 includes, on the side of one of its ends, a mounting zone 90 on the metal base 80 of the package and, on the side of another end, opposite the first, an electromagnetic transition zone 92 at the electromagnetic coupling access port 62, for example for coupling with a waveguide. The rear face 66 of the chip, in the transition zone 92, is not metallized in order to let the electromagnetic waves pass through the contactless access port 62.

The transition zone 92 of the chip preferably includes, on the active face 64, an electrical coupling conductor 96 connected to a microstrip line 98 of the chip, formed by a conductor on the active face and the ground plane 74 of the rear face.

The electromagnetic access port 62 of the package provides a contactless transition for the microwave signals between the component and a waveguide coupled to the component.

The contactless access port 62 is produced, in this example shown in FIGS. 2a and 2b, by the metal cap 84 and the aperture 82 in the metal base, forming a waveguide at the transmit/receive working frequency $F_0$ of the integrated circuit 60.

The dimensions of the various dielectric and conducting parts of the package are such that the component operates correctly at the working frequency $F_0$ in question (77 GHz).

The package includes, on the metal base 80 side, in addition to the electrical ground conductor 93, electrical contact pads 110 for interconnecting the integrated circuit with other electronic components by means of an interconnection substrate.

The electrical conductors 72 on the active face of the chip for other ports of access to the chip, are connected via connection wires 112 to the electrical contact pads of the package. These other contact access ports are intended to transmit, to the chip, the subharmonic frequency of the working frequency $F_0$ (77 GHz), control signals and supply voltages.

The package is sealed by a molding (114), made of a dielectric, covering the active surface of the integrated circuit but exposing the surface for mounting the package, which surface has the electrical mounting pads.

Preferably, the dielectric fills the contactless electromagnetic access port 62 of the package, but in other embodiments, the space between the cap and the metal base may contain a gas surrounding the component, for example air.

Figure 2C:
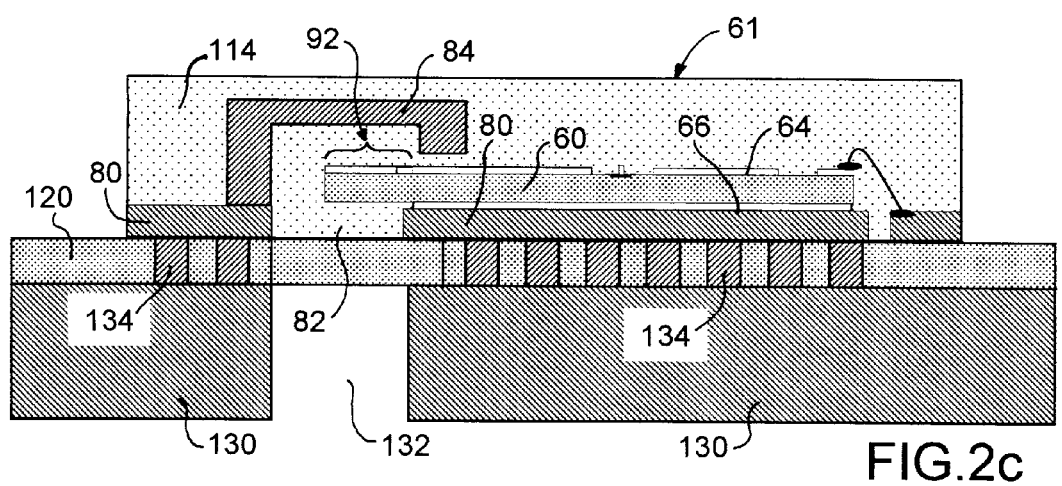
FIG. 2c shows the coupling of the component of FIGS. 2a and 2b with a waveguide.

FIG. 2c shows the coupling of the component of FIGS. 2a and 2b with a waveguide.

Figure 2D:
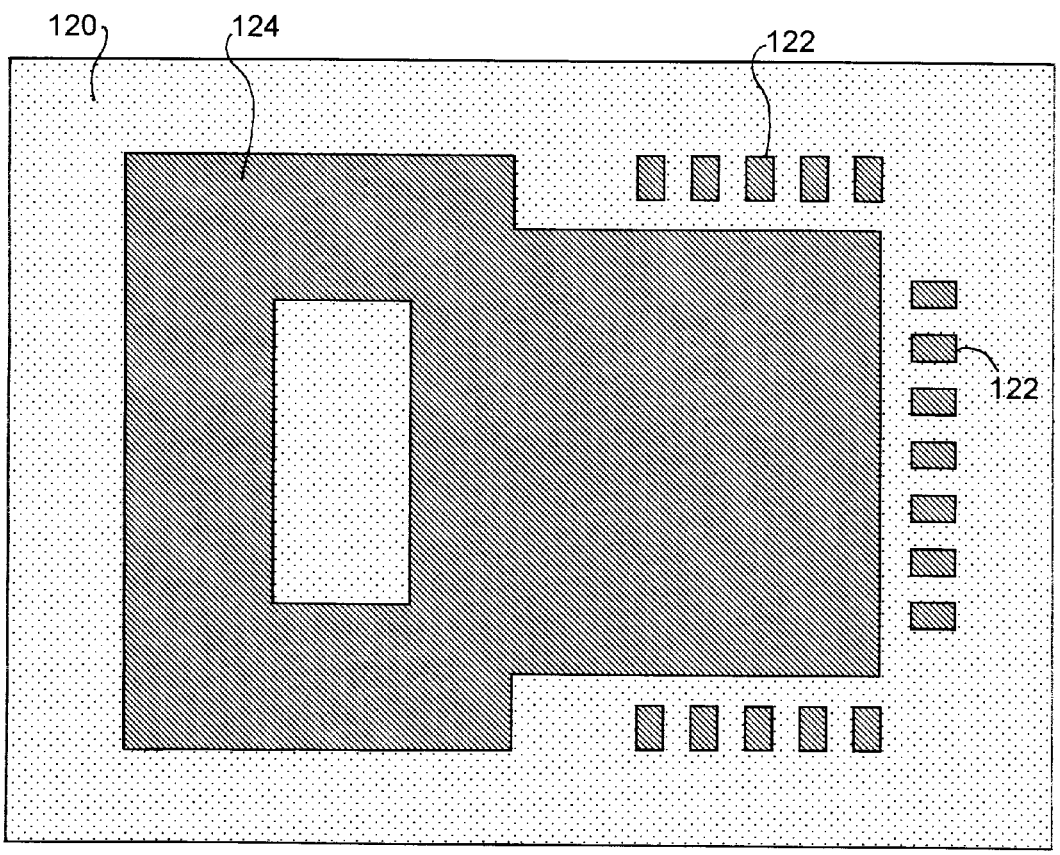
FIG. 2d shows a top view of a coupling substrate in the coupling of FIG. 2c.

The package 61 is mounted on a coupling substrate 120 comprising, on its package mounting face, electrical conductors 122 for interconnection with the electrical contact pads 110 of the package and a ground plane 124. FIG. 2d shows a top view of the coupling substrate of the component of FIGS. 2a and 2b with the waveguide.

The coupling substrate 120 is mounted via its other face on a waveguide 130 in the form of a metal plate having an aperture 132 facing the aperture 82 of the base 80 of the integrated circuit and having the same shape.

Metal transitions 134 between the two faces of the substrate 120 ensure electrical and thermal contact between the metal base of the package 61 and the waveguide 130.

Figure 3A:
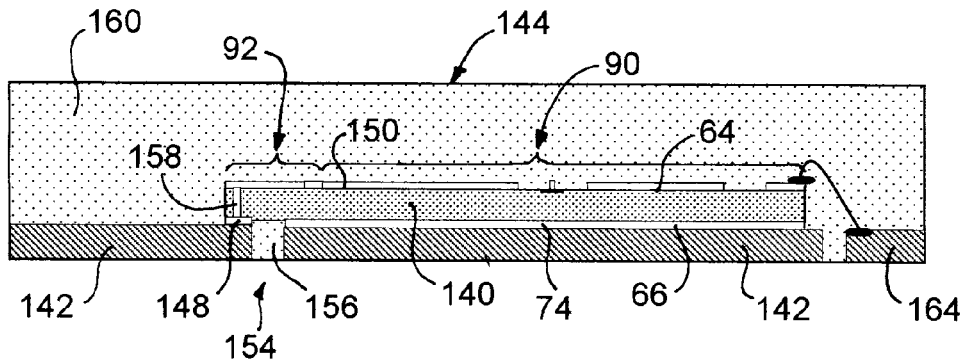
FIGS. 3a and 3b show views of an alternative embodiment of the microwave component of FIGS. 2a and 2b.
Figure 3B:
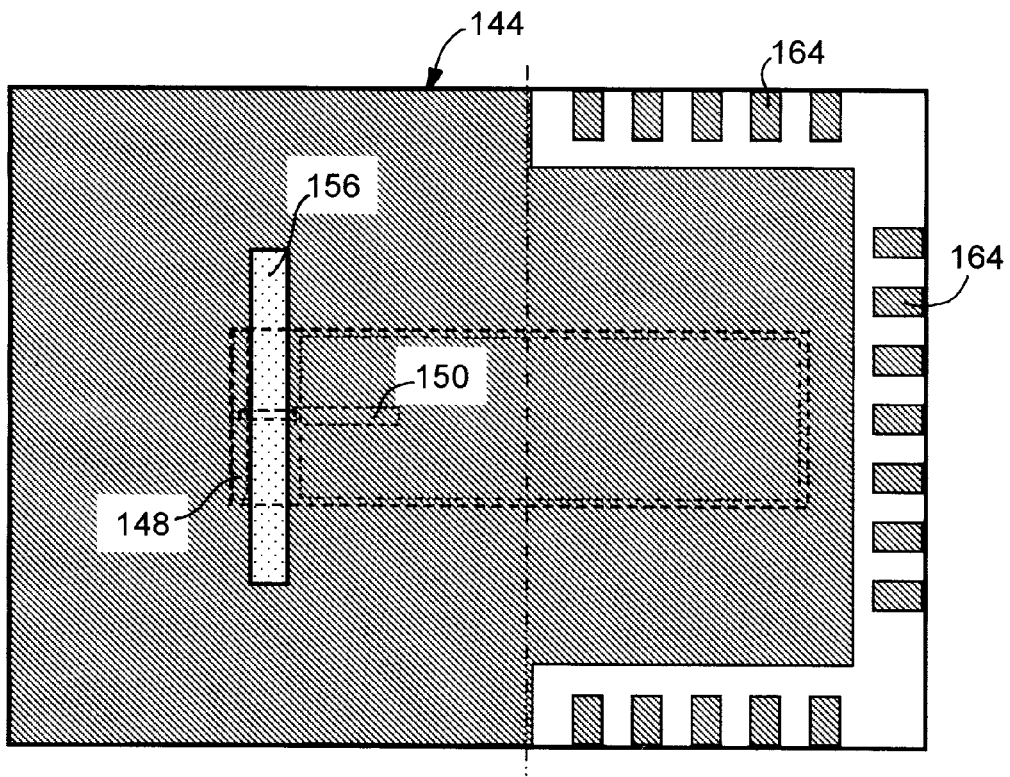

FIGS. 3a and 3b show views of an alternative embodiment of the component according to the invention shown in FIGS. 2a and 2b.

In this embodiment, an MMIC chip 140, mounted on a metal base 142 of an encapsulating package 144, includes, in the transition zone 92, on the rear face 66 side of the chip, an electrical antenna conductor 148 electrically connected to a microstrip line 150 of the chip, formed by a conductor on the active face and the ground plane of the rear face 66 in the chip mounting zone 90. The electrical antenna conductor 148 forms, with the ground plane 74 of the chip mounting zone 90, a slot antenna at the transmit/receive working frequency $F_0$ of the integrated circuit.

The electromagnetic coupling access port 154, in the component shown in FIGS. 3a and 3b, is produced by an aperture 156 in the form of a slot in the metal base 142 facing the slot antenna of the chip in the transition zone 92. The aperture 156 of the base, in the form of a slot, forms a slot line for coupling the component with a waveguide.

The electrical connection between the electrical antenna conductor 148 on the rear face of the chip and the electrical conductor on the active face of the microstrip line is produced by a plated-through hole 158.

The package 144 is sealed by a molding 160, made of a dielectric, covering the active face of the chip but leaving the package mounting surface free. Preferably, the dielectric fills the metal slot 156 of the base 142, directing the electromagnetic field toward the contactless access port 154.

The package 144 includes, on the metal base side, in addition to the electrical ground conductor 74, electrical contact pads 164 for electrically connecting the chip to other access ports of the integrated circuit, for supplying control signals, etc.

Figure 3C:
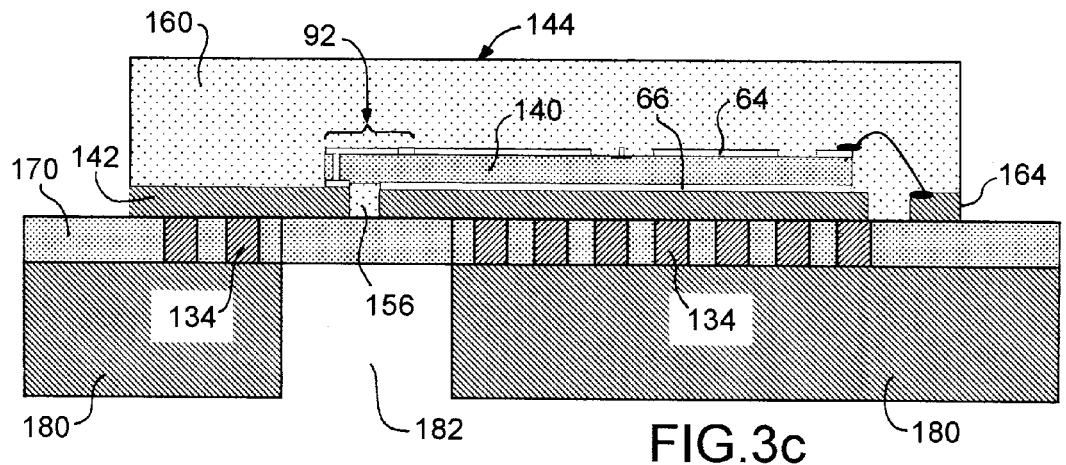
FIG. 3c shows the coupling of the component of FIGS. 3a and 3b with a waveguide.

FIG. 3c shows the coupling of the component of FIGS. 3a and 3b with a waveguide.

Figure 3D:
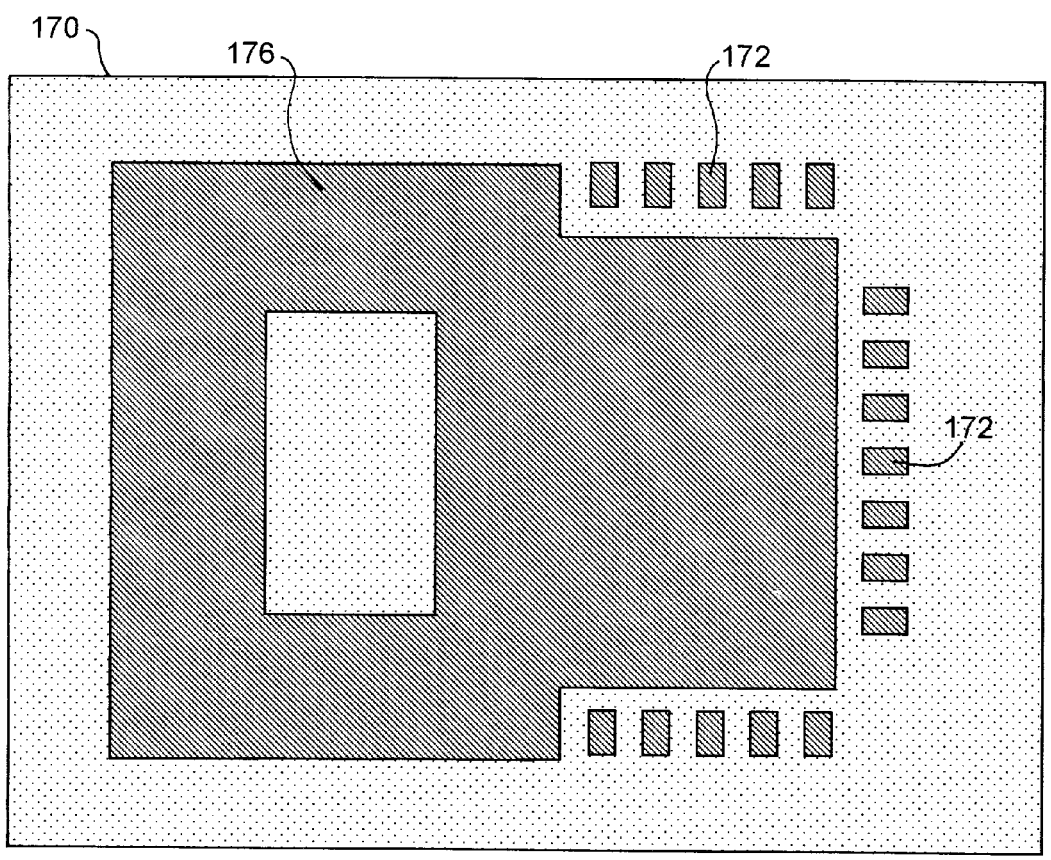
FIG. 3d shows a top view of the coupling substrate in the coupling of FIG. 3c.

The package 144 is mounted on a coupling substrate 170 having, on the package mounting face, electrical conductors 172 for interconnection with the electrical contact pads 164 of the package 144 and a ground plane 176. FIG. 3d shows a view of the coupling substrate 170 on the side with the face for mounting the component on the coupling substrate.

The coupling substrate is mounted via its other face on one of the faces of a waveguide 180 in the form of a metal plate having a rectangular aperture 182 facing the aperture 156 of the base 142. The rectangular aperture of the waveguide 180 may be of larger dimensions than those of the aperture 156 of the base of the package, this aperture 182 of the waveguide 180 possibly also having dimensions identical to the slot-shaped aperture of the base.

In other embodiments of the component according to the invention, the microwave line (98, 150) connecting the coupling conductor (or antenna conductor) in the transition zone 92 of the chip is a coplanar-type line, and in this case, two electrical conductors on the active face of the chip, separated by a certain distance, form the microwave line.

Among the main advantages of the microwave component according to the invention, mention may be made of:
  the elimination of wire-bonding connections operating at the millimetric working frequency $F_0$;
  use of technologies for fabricating the microwave packages that are employed for mass-production applications; and the integrated circuit is compatible with SM (surface mounting) techniques.

These main advantages of the microwave component according to the invention lead to an appreciable reduction in fabrication cost and to performance reproducibility.

The invention claimed is:

1. A miniature microwave component for surface mounting, said component comprising:
   (a) an MMIC microwave chip having an active face and a rear face opposite the active face, said chip further including
      electronic elements and electrical conductors on the active face, and
      electrical conductors including an electrical ground conductor on the rear face, the electrical conductor defining a ground plane; and
   (b) a package encapsulating of the chip, the package including
      a metal base having two faces that include (i) a face for mounting the chip in the package via a rear face of the chip, (ii) a rear face opposite to said face and carrying the electrical ground conductor, wherein said metal base further includes an aperture between the opposite faces for passage of an electromagnetic wave; and
      two access ports in the metal base for communication of electrical signals between the inside and the outside of the package, said two access ports including
         (i) a contactless microwave access port, by electromagnetic coupling at the aperture in the metal base, ensuring transmission of coupling signals at a working frequency $F_0$, and
         (ii) a subharmonic access port via an electrical contact pad, for inputting, into the microwave chip, a subharmonic frequency $F_0/n$ of the working frequency $F_0$, n being an integer number bigger than 1,
   wherein
      the chip further includes, among the electrical conductors, a coupling electrical conductor connected to the electronic elements of the chip, the coupling electrical conductor being placed at the contactless microwave access port in order to transmit microwave signals by electromagnetic coupling at the working frequency $F_0$,
      the package includes electrical contact pads on the rear face of the metal base for interconnecting the chip with other electronic components by an interconnection substrate, and
      the electrical conductors on the active face of the chip are directly connected via connection wires to the electrical contact pads on the rear face of the metal base of the package.

2. The component as claimed in claim 1, wherein the MMIC chip includes,
   on the side of a first end of the chip, a mounting zone on the metal base of the package and,
   on the side of a second end which is opposite to the first end, an electromagnetic transition zone at the electromagnetic coupling access port.

3. The component as claimed in claim 2, wherein the coupling electrical conductor and the ground plane of the chip form a slot antenna for promoting transmission of the working frequency through the contactless microwave access port.

4. The component as claimed in claim 3, wherein the MMIC chip includes, in the transition zone, on the rear face side of the chip, an electrical antenna conductor electrically connected to a microstrip line of the chip formed by a conductor on the active face and the ground plane of the rear face in the chip mounting zone, the electrical antenna conductor forming, with the ground plane of the chip mounting zone, a slot antenna at the transmit/receive working frequency $F_0$ of the integrated circuit.

5. The component as claimed in claim 3, wherein the electromagnetic coupling access port is produced by an aperture in the form of a slot in the metal base facing the slot antenna of the chip in the transition zone, the electrical connection between the electrical antenna conductor on the rear face of the chip and the electrical conductor on the active face of the microstrip line being produced by a plated-through hole.

6. The component as claimed in claim 3, wherein the package is sealed by a molding, which includes a dielectric, covering the active face of the chip but leaving the opposite face of the metal base free for package surface mounting, the dielectric filling the metal slot in the base, directing the magnetic field toward the contactless access port.

7. The component as claimed in claim 2, wherein
   a microwave line connecting the coupling conductor in the transition zone of the chip is a coplanar-type line, and
   two electrical conductors on the active face of the chip, separated by a certain distance, form the microwave line.

8. The component as claimed in claim 7, wherein the coupling conductor is the antenna conductor.

9. The component as claimed in claim 1, wherein the package includes a conducting cap placed a certain distance from the coupling electrical conductor such that it establishes, above the contactless microwave access port, an electromagnetic short-circuit at the working frequency $F_0$, thus forming a wave reflector promoting transmission of the working frequency $F_0$ through the microwave access port.

10. The component as claimed in claim 9, wherein the space between the cap and the metal base contains a gas surrounding the component.

11. The component as claimed in claim 2, wherein
   the chip includes, in the transition zone on the rear face no metallization so that electromagnetic wave is passable through via the contactless access port, and
   the chip includes, in the transition zone on the active face, the coupling electrical conductor connected to a microstrip line of the chip formed by a conductor on the active face and the ground plane of the rear face.

12. The component as claimed in claim 1, wherein the electrical conductors on the active face are configured for transmitting, to the chip, the subharmonic frequency of the working frequency $F_0$, control signals, and supply voltages.

13. The component as claimed in claim 1, wherein the package is sealed by a molding, which includes a dielectric, covering the active face of the chip but leaving the opposite face of the metal base free for mounting the package, which includes electrical mounting pads.

14. The component as claimed in claim 13, wherein the dielectric fills the contactless electromagnetic access port of the package.

15. The component as claimed in claim 1, wherein the microwave chip includes frequency multiplication member for switching the subharmonic frequency $F_0/n$ to the working frequency $F_0$.

* * * * *